US008527690B2

(12) United States Patent
Hamilton et al.

(10) Patent No.: US 8,527,690 B2

(45) Date of Patent: Sep. 3, 2013

(54) OPTIMIZATION OF NON-VOLATILE SOLID-STATE MEMORY BY MOVING DATA BASED ON DATA GENERATION AND MEMORY WEAR

(75) Inventors: James R Hamilton, Bellevue, WA (US); Michael R Fortin, Redmond, WA (US); Mike Neil, Mercer Island, WA (US); Burton J Smith, Seattle, WA (US)

(73) Assignee: Microsoft Corporation, Redmond, WA (US)

( * ) Notice: Subject to any disclaimer, the term of this patent is extended or adjusted under 35 U.S.C. 154(b) by 752 days.

(21) Appl. No.: 12/146,968

(22) Filed: Jun. 26, 2008

(65) Prior Publication Data

US 2009/0327580 A1 Dec. 31, 2009

(51) Int. Cl.
*G06F 13/00* (2006.01)

(52) U.S. Cl.
USPC .................................. 711/103; 711/E12.103

(58) Field of Classification Search
USPC ......................................................... 711/103
See application file for complete search history.

(56) References Cited

U.S. PATENT DOCUMENTS 5,956,289 A 9/1999 Norman et al.
2002/0172081 A1 11/2002 Mukaida et al.
2003/0065751 A1 4/2003 Autor et al.
2003/0227804 A1* 12/2003 Lofgren et al. ............... 365/200
2005/0166005 A1* 7/2005 Nagano et al. ................ 711/103
2006/0015781 A1 1/2006 Rothman et al.
2006/0198202 A1 9/2006 Erez
2006/0239075 A1 10/2006 Williams et al.
2007/0032979 A1 2/2007 Hamann et al.
2007/0038802 A1 2/2007 Tsai et al.
2007/0133285 A1 6/2007 Lee et al.
2007/0260811 A1* 11/2007 Merry et al. .................. 711/103
2008/0140918 A1* 6/2008 Sutardja ........................ 711/103
2008/0147998 A1* 6/2008 Jeong ............................ 711/161
2008/0270730 A1* 10/2008 Lasser et al. .................. 711/170
2008/0288712 A1* 11/2008 Cornwell et al. ............. 711/103
2009/0138654 A1* 5/2009 Sutardja ........................ 711/103

FOREIGN PATENT DOCUMENTS

WO WO2007062256 A2 5/2007

OTHER PUBLICATIONS

Wu, et al., "eNVy: A Non-Volatile, Main Memory Storage System", available at least as early as Jul. 5, 2007, at <<http://citeseer.ist.psu.edu/cache/papers/cs/2044/http:zSzzSzwww.cs.rice.eduzSzCSzSzSystemszSzpaperszSzenvy-asplos94.pdf/wu94envy.pdf>>, pp. 12.

* cited by examiner

*Primary Examiner* — Edward Dudek, Jr.
*Assistant Examiner* — Sean D Rossiter
(74) *Attorney, Agent, or Firm* — Lee & Hayes, PLLC

(57) ABSTRACT

An exemplary method includes writing data to locations in non-volatile solid-state memory and deciding whether to move data written to one location in the memory to another location in the memory based on generation of the data and wear of the other location. Such a method may be used for non-volatile random access memory (NVRAM). Various other methods, devices, systems, etc., are also disclosed.

19 Claims, 7 Drawing Sheets

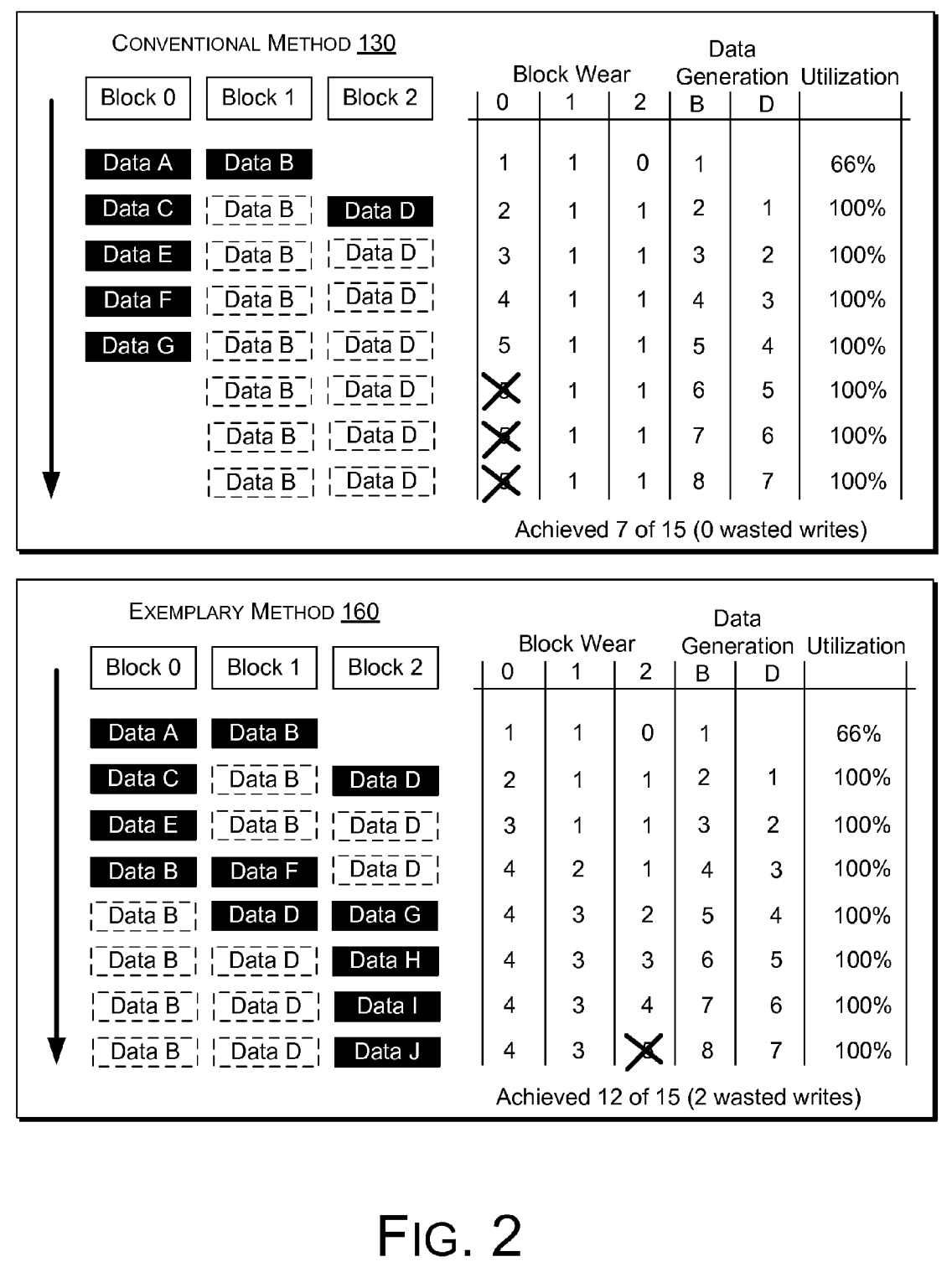

CONVENTIONAL METHOD 130

| Block 0 | Block 1 | Block 2 | Block Wear 0 | Block Wear 1 | Block Wear 2 | Data Generation B | Data Generation D | Utilization |
|---|---|---|---|---|---|---|---|---|
| Data A | Data B | | 1 | 1 | 0 | 1 | | 66% |
| Data C | Data B | Data D | 2 | 1 | 1 | 2 | 1 | 100% |
| Data E | Data B | Data D | 3 | 1 | 1 | 3 | 2 | 100% |
| Data F | Data B | Data D | 4 | 1 | 1 | 4 | 3 | 100% |
| Data G | Data B | Data D | 5 | 1 | 1 | 5 | 4 | 100% |
| | Data B | Data D | ~~5~~ | 1 | 1 | 6 | 5 | 100% |
| | Data B | Data D | ~~5~~ | 1 | 1 | 7 | 6 | 100% |
| | Data B | Data D | ~~5~~ | 1 | 1 | 8 | 7 | 100% |

Achieved 7 of 15 (0 wasted writes)

EXEMPLARY METHOD 160

| Block 0 | Block 1 | Block 2 | Block Wear 0 | Block Wear 1 | Block Wear 2 | Data Generation B | Data Generation D | Utilization |
|---|---|---|---|---|---|---|---|---|
| Data A | Data B | | 1 | 1 | 0 | 1 | | 66% |
| Data C | Data B | Data D | 2 | 1 | 1 | 2 | 1 | 100% |
| Data E | Data B | Data D | 3 | 1 | 1 | 3 | 2 | 100% |
| Data B | Data F | Data D | 4 | 2 | 1 | 4 | 3 | 100% |
| Data B | Data D | Data G | 4 | 3 | 2 | 5 | 4 | 100% |
| Data B | Data D | Data H | 4 | 3 | 3 | 6 | 5 | 100% |
| Data B | Data D | Data I | 4 | 3 | 4 | 7 | 6 | 100% |
| Data B | Data D | Data J | 4 | 3 | ~~5~~ | 8 | 7 | 100% |

Achieved 12 of 15 (2 wasted writes)

FIG. 2

OPTIMIZATION OF NON-VOLATILE SOLID-STATE MEMORY BY MOVING DATA BASED ON DATA GENERATION AND MEMORY WEAR

BACKGROUND

Solid-state memory is used widely to store information. So-called "flash" memory is a particular type of solid-state memory that is also commonly referred to as non-volatile RAM (NVRAM). NVRAM requires no power for storage of information. NVRAM can be found in a variety of consumer devices, control systems and servers (e.g., blades of a data center).

Solid-state memory has a limited lifetime. Often, the lifetime is specified in terms of write-erase cycles (e.g., several million cycles or more) and depends on quality of manufacture, etc. As a block approaches its lifetime number of write-erase cycles, the reliability of that block becomes suspect. Depending on the nature of the data stored, a solid-state memory may last days or years.

With respect to write and erase operations, a write operation typically writes data ("0" s) to pages that may be a couple of kilobytes in size while an erase operation typically erases data ("1" s) from a number of pages, which are often referred to as blocks. With respect to read operations, a read operation can occur quickly, usually in microseconds, and does not count as a cycle operation.

Solid-state memory may support a log file system. A log file system requires storage of a log. The log tracks addresses or locations for data stored in solid-state memory. Depending on how the log file is stored and updated, it may increase life of solid-state memory or it may decrease life of solid-state memory. For example, if it is stored in a dedicated location, the memory may fail once that location reaches its write-erase cycle limit. Such issues exist for a so-called "inode" of a log file system when it lives at a dedicated memory location.

Wear-levelling is a term generally applied to techniques that aim to "level" wear of solid-state memory in a manner that extends lifetime. Conventional approaches to wear-levelling include use of chip firmware or file system drivers to count writes and dynamically remap blocks to spread the write operations. Another approach is to perform write verification and remapping to spare sectors in case of write failure, a technique called bad block management (BBM). For portable consumer devices, such techniques may extend the life of flash memory beyond the life of its portable consumer device. Such devices can often accept some degree of data loss. For high reliability data storage, however, it is not advisable to use flash memory that has been through a large number of programming cycles. This limitation does not apply to read-only applications such as thin clients and routers, which are only programmed once or at most a few times during their lifetime.

As to specific terminology often associated with NVRAM, an address is a row address and a column address where the row address identifies the page and block to be accessed and where the column address identifies the byte or word within a page to access. A block, as mentioned, consists of multiple pages and is typically the smallest addressable unit for erase operations. A logical unit number (LUN) is typically the minimum unit that can independently execute commands and report status. A page is typically the smallest addressable unit for read and program operations. For targets that support partial page programming, the smallest addressable unit for program operations is a partial page if there are partial programming constraints. A page register is normally used to read data that was transferred from a NVRAM array. For program operations, the data is placed in this register prior to transferring the data to the array.

Often, each LUN has at least one page register, which is used for temporary storage of data before it is moved to a page within a NVRAM array or after it is moved from a page within the array. In an example, if the number of pages per block is 96, then the page address is normally rounded to 7 bits such that it can address pages in the range of 0 to 127. In this case, the host will not access pages in the range from 96 to 127 as these pages are not supported. The page address always uses the least significant row address bits. The block address uses the middle row address bits and the LUN address uses the most significant row address bit(s).

Various exemplary techniques are described herein for optimizing usage of solid-state memory. Particular techniques perform wear-levelling to extend lifetime of solid-state memory, especially NVRAM.

SUMMARY

An exemplary method includes writing data to locations in non-volatile solid-state memory; and deciding whether to move data written to one location in the memory to another location in the memory based on generation of the data and wear of the other location. Various other methods, devices, systems, etc., are also disclosed.

DESCRIPTION OF DRAWINGS

Non-limiting and non-exhaustive examples are described with reference to the following figures:

FIG. 2 is a diagram of a convention method and a diagram of an exemplary method for optimizing memory;

DETAILED DESCRIPTION

An exemplary method optimizes memory based in part on data generation in memory and memory wear. In the description that follows, memory is referred to as having "blocks". The term "block" refers generally to a portion of memory, which may be a page or other portion of memory. While the Background section mentions a distinction between blocks and pages with respect to write and erase operations, as described herein portions of memory may be written to or erased as desired, regardless of the particular terminology. Various examples may adhere to the conventions mentioned in the Background section while still achieving memory optimization.

Figure 1:
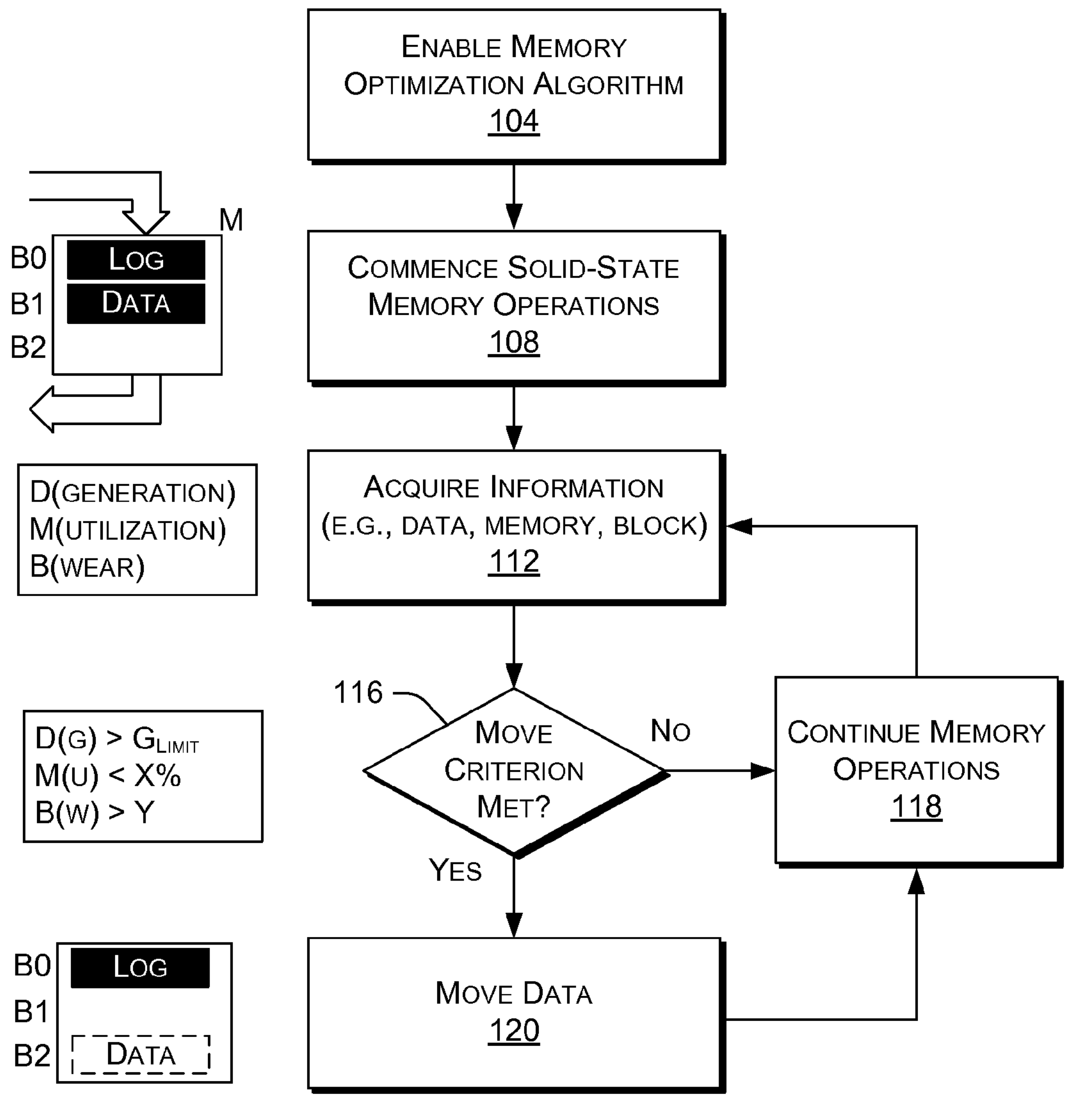
FIG. 1 is a block diagram of an exemplary method for optimizing memory.

FIG. 1 shows an exemplary method 100 for memory optimization. The method 100 includes an enablement block 104 that enables a memory optimization algorithm. As described herein, an exemplary memory optimization algorithm decides whether data stored in a location in memory should be moved to a different location in memory. Such an algorithm relies on age of the data (e.g., generation) and wear of the location in where the data is currently stored. In general, the algorithm decides to move older data to more worn memory locations.

In principle, the algorithm accounts for data that may persist for a long time and data that may persist for a short time. Data that persists for a short time is likely to be erased or overwritten. Correspondingly, memory blocks that store such data are likely to wear out much faster than memory blocks that store data that persists for a long time. To balance wear, the algorithm can decide to move data that persists (or is likely to persist) for a long time to memory blocks that are becoming worn. In turn, this frees up the less worn memory blocks. Overall, the algorithm aims to achieve a "one-hoss shay" effect where all memory blocks end their reasonable lifetime simultaneously (e.g., "une mort subite" or sudden death).

In a commencement block 108, solid-state memory operations commence. For example, non-volatile RAM with multiple blocks that stores data according to a log file system may store some data in a block where the block and data are associated by an entry in the log. While the diagram in FIG. 1 shows a "log" as being stored in the multiblock (B0, B1, B2) memory "M", a log may be stored separately from the memory M being optimized.

An acquisition block 112 acquires information about the memory and its data. For example, data may have a parameter "g" that indicates generation or age of the data in the memory M. While "g" may be a direct age or generation, alternatively, it may be a parameter that indicates a likelihood of persistence. Consider photographs stored in the form of image files such as fn.jpg. If such a file persists for a few generations or days, the likelihood of it persisting for a long time increases. Hence, information such as data type, file type, etc., may also be used by an exemplary algorithm.

Also shown in FIG. 1 is a parameter "u", which is associated with memory M and represents utilization. For example, the parameter "u" may be a percent of the total memory (i.e., 80% utilized). Yet another parameter is "w", which represents wear of a location or grouped locations in memory M. For example, each block (B0, B1, B2) may have an associated wear parameter where the value of the parameter changes with respect to write operations (and optionally erase or erase and write operations).

A decision block 116 decides if one or more move criteria are met. For example, such a decision may rely on an algorithm that considers generation of data stored at a location, utilization of memory and wear of one or more blocks of memory. As shown in FIG. 1, generation of data may be compared to a generation limit, utilization may be compared to a utilization limit and wear may be compared to a wear limit. The particular manner by which each of these parameters may be considered is explained further below.

According to the decision block 116, a decision to move data causes the method 100 to continue to a move block 120 that moves the data (see, e.g., movement of data from block B1 to block B2). In addition, the movement of the data to a different location is noted in the log. If the decision block 116 decides not to move data, then the method 100 proceeds, per a continue memory operations block 118.

FIG. 2 shows an example of a convention method 130 and an exemplary method 160 where the exemplary method 160 optimizes memory. In these rudimentary examples, three blocks of memory are shown along with corresponding block wear, data generation and memory utilization. Such wear, generation and utilization information may be tracked and stored in memory (e.g., in the solid-state memory being optimized). An arrow represents time for eight cycles. In the example of FIG. 2, each block has a lifetime of 5 data writes. Overall, the memory has a maximum of 15 data writes. A goal of an optimization algorithm may be to come as close as possible to the maximum number of data writes.

For the method 130, in a first cycle data A is written to block 0 and data B is written to block 1 while block 2 is unoccupied. In a second cycle, data A does not persist and data C is written to block 0 while data B persists in block 1 and data D is written to block 2. In cycles 3 through 8, data B persists in block 1 and data D persists in block 2, which leaves only block 0 available for write operations. Block 0 reaches its maximum number of data writes in cycle 5. Overall, the memory achieved 7 out of 15 possible data writes; noting that all data writes were "useful".

For the method 160, an algorithm decides to move data based at least on the generation of the data and the wear of one or more memory blocks. In a first cycle data A is written to block 0 and data B is written to block 1 while block 2 is unoccupied. In a second cycle, data A does not persist and data C is written to block 0 while data B persists in block 1 and data D is written to block 2. In cycle 3, data E is written to block 0 while data B persists in block 1 and data D persists in block 2. In cycle 4, data B has reached (or exceeded) a generation limit, which causes an algorithm to decide whether data B should be moved to a more worn block. As block 0 has the highest wear (3 out of 5), data B is moved to block 0, which may be considered a "wasted" move as it increases block 0 one step toward its lifetime limit without storing "new" data to memory. In cycle 4, data F is written to block 1 and data D persists in block 2.

In cycle 5, data D has reached (or exceeded) a generation limit, which causes an algorithm to decide whether data D should be moved to a more worn block. As block 1 has more wear than block 2, data D the algorithm decides to move data D to block 1. This frees block 2 for writing of data G. In cycles 6 to 8, data B persists in block 0 while data D persists in block 1 and data H, data I and data J are successively written to block 2. Overall, the memory achieved 12 out of 15 possible data writes with two wasted writes (e.g., 10 useful data writes).

In the example of FIG. 2, given 9 cycles, it may have been possible to move data D back to block 2 in cycle 8, which would have freed up block 1 for two more additional data writes (e.g., for data J in cycle 8 and data K in cycle 9). Such a move could be made on the basis that block 2 became more worn that block 1. This would have achieved 14 out of 15 possible data writes in 9 cycles, with 3 "wasted" data writes (e.g., 11 useful data writes).

Figure 3:
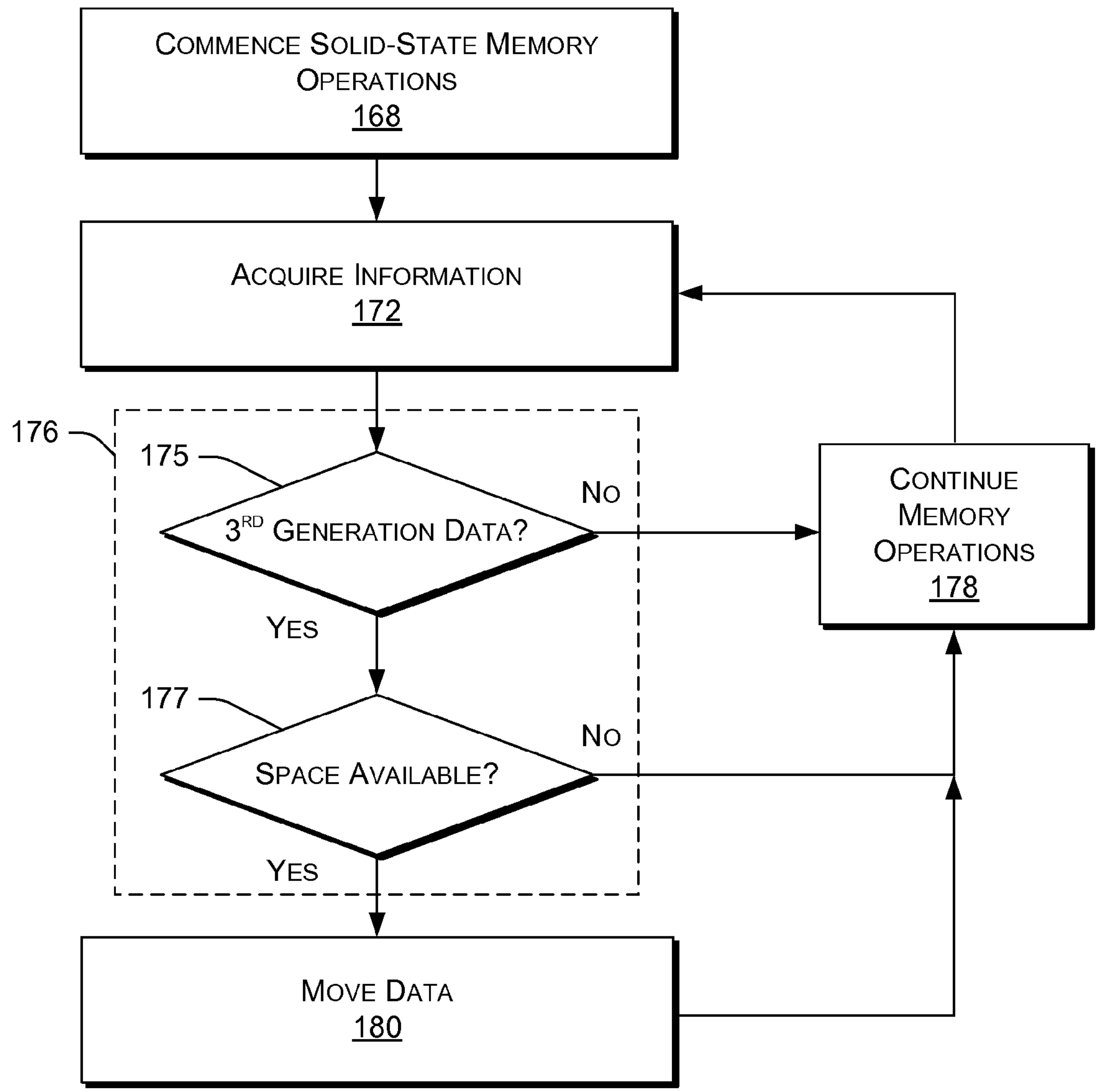
FIG. 3 is a block diagram of the exemplary method of FIG. 2 for optimizing memory.

FIG. 3 shows a block diagram of the exemplary method 160 of FIG. 2. In a commencement block 168, solid-state memory operations commence. In an acquisition block 172, information is acquired as to data generation. In a decision process 176, a decision block 175 decides if any third generation data is stored in memory. If "no", the method 160 proceeds to a block 178 to continue memory operations while if "yes", the method 160 proceeds to another decision block 177 that decides if space is available (e.g., memory utilization less than 100% or space available for the $3^{rd}$ generation data). If no space is available, the method 160 proceeds to the continuation block 178 otherwise the method 160 proceeds to the move block 180 where the $3^{rd}$ generation data is moved (e.g., to a more worn portion of memory).

Figure 4:
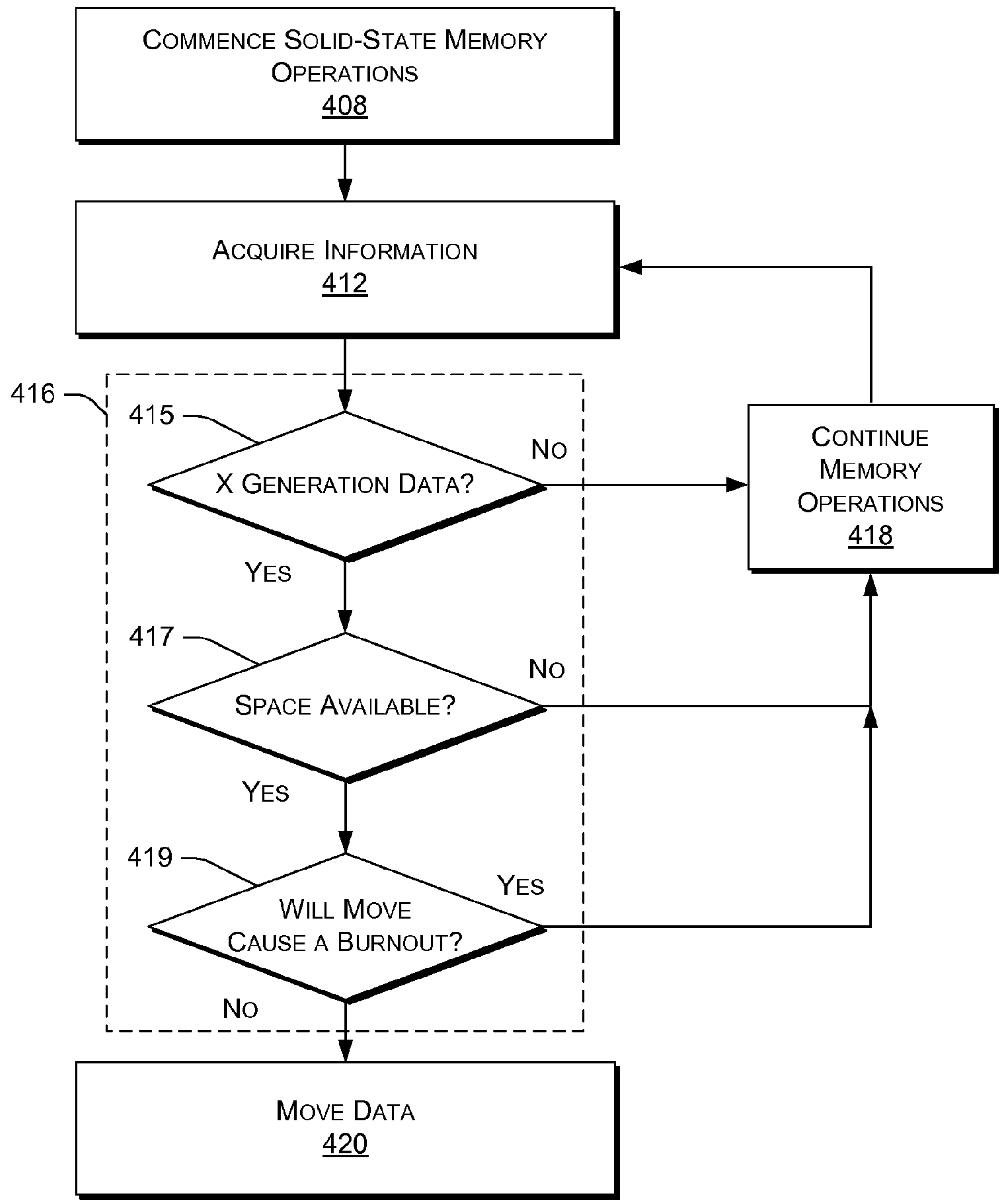
FIG. 4 is a block diagram of an exemplary method for optimizing memory based in part on data generation, memory utilization and whether movement of data from one memory location to another may be detrimental.

FIG. 4 shows a block diagram of an exemplary method 400. The method 400 includes various blocks akin to the method 160 of FIGS. 2 and 3. For example, the method 400 includes a commencement block 408 and an acquisition block 412, as well as a decision process 416. In general, the acquisition block 412 acquires information for use by the decision process 416 which may be considered an optimization algorithm or part thereof. The method 400 also includes a continuation block 418 and a move block 420.

The decision process 416 of the method 400 includes a decision block 415 that makes a decision based on generation information, a decision block 417 that makes a decision based on utilization information and a decision block 419 that makes a decision based on "burnout" information (i.e., if a move will or is likely to cause a block or blocks of memory as a whole to reach an end of lifetime or an acceptable level of reliability). Such a decision can reduce the number of wasted moves where, otherwise, high generation data may be moved too frequently.

Figure 5:
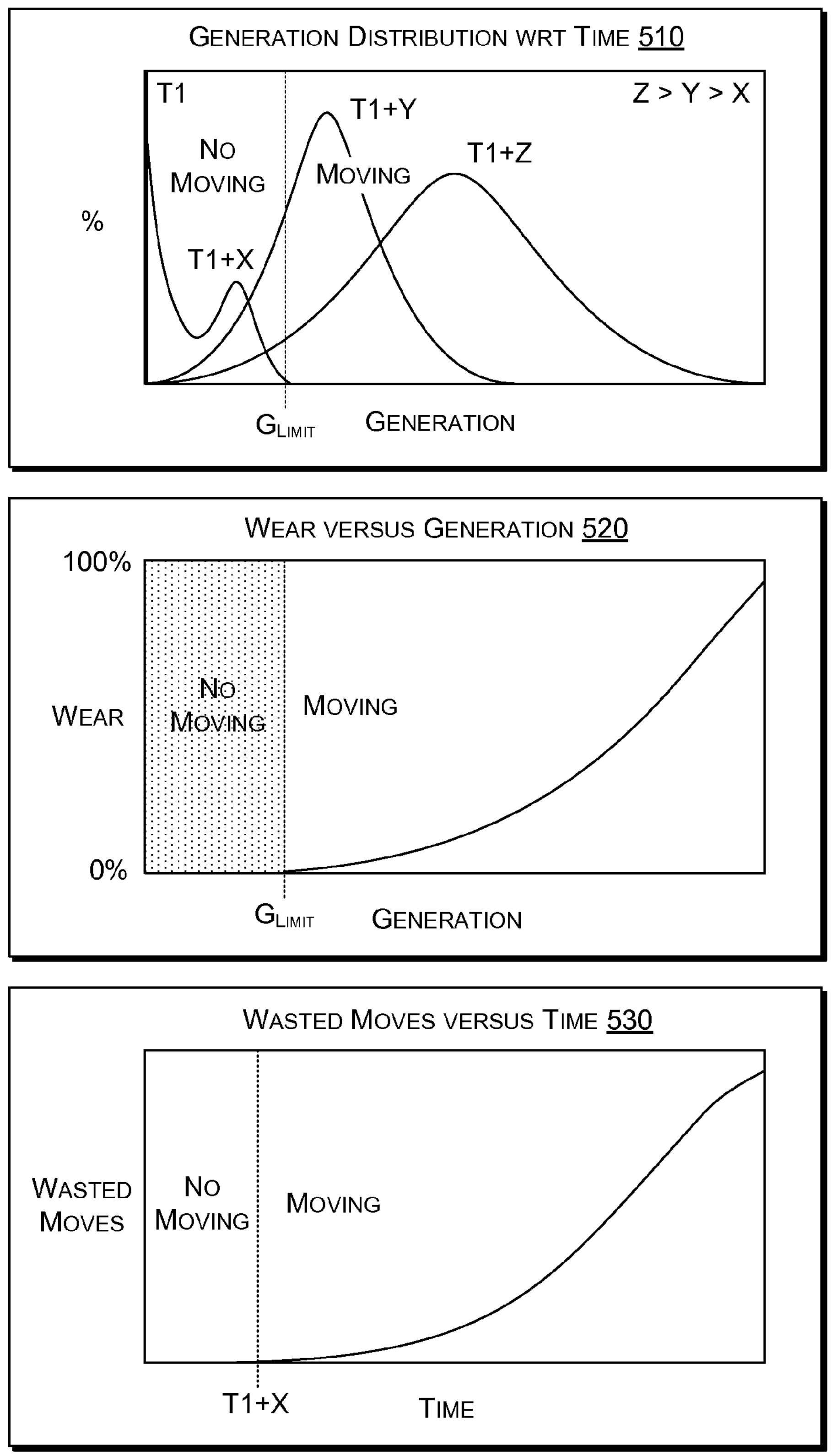
FIG. 5 is a series of plots that illustrate an exemplary principle of operation for optimizing memory based in part on data generation and memory wear.

FIG. 5 shows a series of plots 510, 520 and 530 that aim to demonstrate a principle of operation. The plot 510 shows percent of data versus generation of data over time. The plot 510 includes distributions for data at various points in time. At some sufficiently long time, it may be expected that the data in memory has a substantially normal (Gaussian) distribution. However, at earlier points in time, the distribution may be quite different. The plot 510 includes a generation limit ($G_{Limit}$) as a criterion that calls for younger generation data to remain stationary and older generation data to be considered for moving.

The plot 520 show memory wear versus generation where, again, if generation of data is less than a generation limit, no movement occurs for that data. Hence, the young data may be in a low wear or a high wear portion of memory. However, older generation data (greater than the generation limit) tends to be moved to more worn portions of memory. Indeed, the oldest generation data corresponds to the most worn portions of memory.

The plot 530 shows wasted moves versus time where no moves occur for a time less than T1+X, which corresponds to no data of a generation greater than the generation limit of the plot 510. However, after time T1+X, movement of data can occur. Correspondingly, the number of "wasted" moves can be expected to increase with respect to time (e.g., until some other condition may cause wasted moves to occur less frequently or to not occur).

Figure 6:
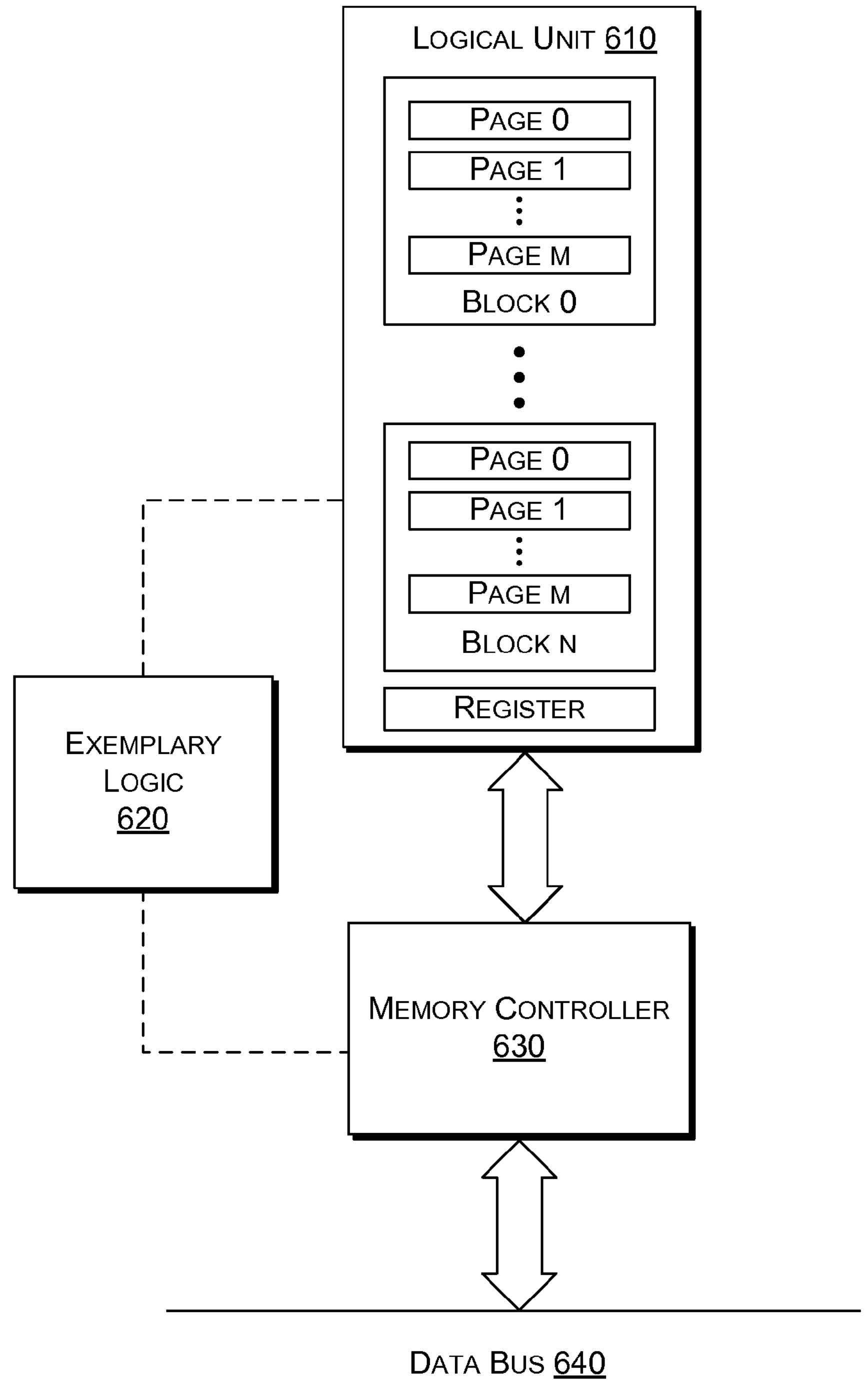
FIG. 6 is a block diagram of an exemplary system that includes logic to optimize memory.

FIG. 6 shows an exemplary system 600 for optimizing memory. The system 600 includes a logical unit 610 of memory that may be arranged according to pages and blocks and that may include a register (e.g., a page register). A memory "chip" may include more than one logical unit. As shown in FIG. 6, a memory controller 630 controls flow of data into and out of the logical unit 610 in response to memory operations (e.g., of a computer or computing device). Data may flow along a data bus 640. As described herein, exemplary logic 620 optimizes memory. Such exemplary logic may be implemented in hardware, software (e.g., firmware) or a combination of hardware and software. Such logic may exist as a part of memory or as part of a memory controller. Further, such logic may exist upstream a memory controller. An operating system of a computing device may include the exemplary logic 620. Further, an operating system may provide information in addition to generation, wear and utilization information. As mentioned, an algorithm or logic may operate based in part on information about type of data, type of file, etc. An operating system is typically in a position to acquire or provide such information.

The exemplary logic 620 may include a model such as a Markov model that assists or makes decisions as to movement of data from one memory location to another memory location.

As described herein, an exemplary method may be implemented at least in part by a computing device and include writing data to locations in non-volatile solid-state memory and deciding whether to move data written to one location in the memory to another location in the memory based on generation of the data and wear of the other location. In such a method, the generation may be a number of writes (e.g., write operations to the memory or write cycles) for which the data persisted in the memory, alternatively, the generation may be a length of time for which the data persisted in the memory. In another alternative, the generation is an approximation of a likelihood that the data will persist from some number of cycles, time, etc., in the memory. With respect to wear, wear of a location typically depends a number of times data has been written to the other location.

As explained, an exemplary method may move data from one location in memory to another location in memory where the other location has a greater wear. A decision process may make such a decision by comparing the generation of the data to a generation limit. Further, a method may include selecting the other location based on its wear.

In various examples, non-volatile solid-state memory can include a log. In various examples, a decision may be based in part on assessing utilization of memory. For example, a method may decides to not move data if the utilization of the memory exceeds a utilization limit. As explained with respect to FIG. 5, data in locations in non-volatile solid-state memory may have a normal distribution of data generations (especially after some amount of time or number of write cycles). Where location is mentioned, a location may be a block of memory. Various methods may be implemented, at least in part, using one or more computer-readable media that include computer-executable instructions.

As described herein, an exemplary method for generational wear-leveling in non-volatile random access memory (NVRAM) (where the NVRAM includes multiple blocks) includes maintaining a wear value for each block and a generation value for data written to a block (see, e.g., FIG. 2) and wear-leveling the NVRAM by moving data to a block with a higher wear value when the generation value of the data exceeds a generation limit. In such a method, the wear value may be a percentage of writes performed (e.g., 50% for 100,000 writes performed for a rated lifetime of 200,000 writes). In such a method, the generation value may be an approximation of a likelihood that data will remain static over a threshold number of writes.

An exemplary method can include (a) allocating a subset of the NVRAM for a log file; (b) constraining relocation of data at block addresses outside of the log file to block addresses in the log file to increase wear on the subset; (c) relocating data blocks with a respective low generation value to block addresses in the log file; (d) allocating a different subset of the NVRAM for the log file; and (e) performing operations associated with (b), (c), and (d) until the multiple blocks can no longer support useful writes.

Various methods may include maintaining for each block or portion of memory, a residency value indicating length of residence of data at an address associated with the block or portion, for example, where the residency may be used when decay of the memory is of concern.

Figure 7:
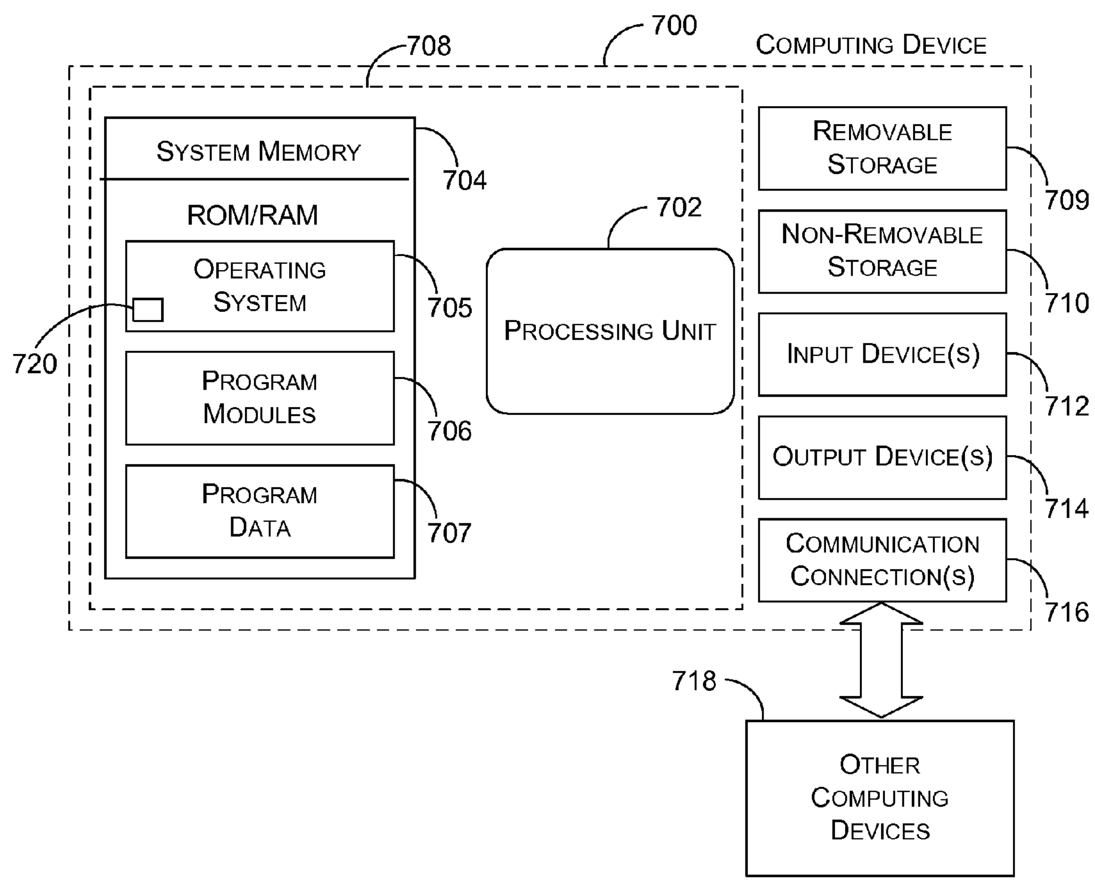
FIG. 7 is a block diagram of an exemplary computing device.

An exemplary system can include non-volatile solid-state memory, a memory controller to write data to locations in the non-volatile solid-state memory and control logic to decide whether to move data written to one location in the memory to another location in the memory based on generation of the data and wear of the other location FIG. 7 illustrates an exemplary computing device 700 that may be used to implement various exemplary components and in forming an exemplary system (see, e.g., system 600 of FIG. 6).

In a very basic configuration, computing device 700 typically includes at least one processing unit 702 and system memory 704. Depending on the exact configuration and type of computing device, system memory 704 may be volatile (such as RAM), non-volatile (such as ROM, flash memory, etc.) or some combination of the two. System memory 704 typically includes an operating system 705, one or more program modules 706, and may include program data 707. The operating system 705 include a component-based framework 720 that supports components (including properties and events), objects, inheritance, polymorphism, reflection, and provides an object-oriented component-based application programming interface (API), such as that of the .NET™ Framework manufactured by Microsoft Corporation, Redmond, Wash. The device 700 is of a very basic configuration demarcated by a dashed line 708. Again, a terminal may have fewer components but will interact with a computing device that may have such a basic configuration.

Computing device 700 may have additional features or functionality. For example, computing device 700 may also include additional data storage devices (removable and/or non-removable) such as, for example, magnetic disks, optical disks, or tape. Such additional storage is illustrated in FIG. 7 by removable storage 709 and non-removable storage 710. Computer storage media may include volatile and nonvolatile, removable and non-removable media implemented in any method or technology for storage of information, such as computer readable instructions, data structures, program modules, or other data. System memory 704, removable storage 709 and non-removable storage 710 are all examples of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by computing device 700. Any such computer storage media may be part of device 700. Computing device 700 may also have input device(s) 712 such as keyboard, mouse, pen, voice input device, touch input device, etc. Output device(s) 714 such as a display, speakers, printer, etc. may also be included. These devices are well know in the art and need not be discussed at length here.

Computing device 700 may also contain communication connections 916 that allow the device to communicate with other computing devices 718, such as over a network. Communication connections 716 are one example of communication media. Communication media may typically be embodied by computer readable instructions, data structures, program modules, etc. Communication may occur via wire (e.g., a wired network, a direct-wired connection, etc.) or wirelessly (e.g., acoustic, RF, infrared and other wireless transmission).

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. A method implemented at least in part by a computing device, the method comprising:

determining whether to move an amount of data currently written to a first location in a non-volatile solid state memory to a second location in the non-volatile solid state memory based at least in part on a type-indicator for the amount of data currently written to the first location, the type-indicator being one of a data type-indicator that is indicative of a type of data or a file type-indicator that is indicative of a type of file;

assessing a current utilization of the non-volatile solid state memory, the current utilization of the non-volatile solid state memory being indicative of a current percentage of the non-volatile solid state memory in which data is currently stored;

determining to not move the amount of data currently written to the first location if the current utilization of the non-volatile solid state memory exceeds a utilization limit; and moving the amount of data currently written to the first location in the non-volatile solid state memory to the second location in the non-volatile solid state memory responsive to determining to move the amount of data.

2. The method of claim 1, further comprising:

determining a number of write cycles for which the amount of data currently written to the first location persisted in the first location of the non-volatile solid state memory; and determining wear of the second location, wherein determining whether to move the amount of data currently written to the first location in the non-volatile solid state memory to the second location in the non-volatile solid state memory is further based at least in part on the number of write cycles for which the amount of data currently written to the first location persisted in the first location and the wear of the second location.

3. The method of claim 1, further comprising:

determining a length of time for which the amount of data currently written to the first location persisted in the first location of the non-volatile solid state memory;

determining wear of the second location; and the deciding whether to move the amount of data currently written to the first location in the non-volatile solid state memory to the second location in the non-volatile solid state memory is further based at least in part on the length of time for which the amount of data currently written to the first location persisted and the wear of the second location.

4. The method of claim 1, further comprising:

determining a number of times a respective amount of data has been written to the second location; and the deciding whether to move the amount of data currently written to the first location in the non-volatile solid state memory to the second location in the memory is further based at least in part on the number of times a respective amount of data has been written to the second location.

5. The method of claim 1, wherein determining whether to move the amount of data currently written to the first location in the non-volatile solid state memory comprises:

determining a data persistence indicator for the amount of data currently written to the first location, the data persistence indicator being one of a number of write cycles for which the amount of data currently written to the first location persisted in the first location of the non-volatile solid state memory and a length of time for which the amount of data currently written to the first location persisted in the first location of the non-volatile solid state memory;

determining wear of the second location;

comparing the data persistence indicator to a generation limit; and responsive to the data persistence indicator being less than the generation limit, determining to not move the amount of data currently written to the first location.

6. The method of claim 1, wherein determining whether to move the amount of data currently written to the first location in the non-volatile solid state memory comprises selecting the second location based at least in part on wear of the second location and wear of the first location.

7. The method of claim 1, the first location comprises a first block of the non-volatile solid state memory and the second location comprises a second, different block of the non-volatile solid state memory

8. The method of claim 1, wherein determining whether to move the amount of data currently written to the first location in a non-volatile solid state memory to the second location in the non-volatile solid state memory comprises:

determining whether a data generation value for the amount of data currently written to the first location in the non-volatile solid state memory is below a generation limit, wherein the data generation value is indicative of a number of write cycles that the amount of data currently written to the first location in the non-volatile solid state memory has persisted in the in the non-volatile solid state memory; and determining to not move the amount of data currently to the first location if the data generation value is below the generation limit.

9. A method implemented by a computer for generational wear-leveling in non-volatile random access memory (NVRAM), the NVRAM comprising multiple blocks, the method comprising:

maintaining a respective wear value for each block of the NVRAM, and maintaining a respective data generation value for a respective amount of data currently written to a respective block for each block of the NVRAM, wherein the data generation value is indicative of a number of write cycles that the amount of data currently written to a respective block has persisted in the NVRAM;

determining a total memory utilization value that is indicative of a current amount of blocks of the NVRAM currently storing data;

determining whether to move a respective amount of data currently written to a first block to a second block based at least in part on the total memory utilization value for the NVRAM being below a utilization limit and the data generation value for the respective amount of data currently written to the first block, wherein the respective amount of data written to the first block is not moved if the total memory utilization value exceeds the utilization limit; and responsive to determining to move the respective amount of data currently written to the first block to the second block, wear-leveling the NVRAM by moving the respective amount of data currently written to the first block to the second block, wherein the second block has a higher wear value than the first block.

10. The method of claim 9 further comprising determining a ratio of a number of writes for a respective block to an expected lifetime number of writes, the respective wear value for the respective block being the ratio.

11. The method of claim 9 further comprising approximating a likelihood that a respective amount of data currently written to a respective block will remain static over a threshold number of writes, the respective data persistence value for the respective block being the determined approximation.

12. The method of claim 9, further comprising:

(a) allocating a subset of the NVRAM for a log file;

(b) constraining relocation of data at block addresses outside of the log file to block addresses in the log file to increase wear on the subset;

(c) relocating data blocks with a respective low data persistence value to block addresses in the log file;

(d) allocating a different subset of the NVRAM for the log file; and (e) performing operations associated with (b), (c), and (d) until the multiple blocks can no longer support useful writes.

13. The method of claim 9, further comprising maintaining for each block of the multiple blocks, a residency value indicating length of residence of data at an address associated with the block, the residency being used when decay of the NVRAM is of concern.

14. The method of claim 9, further comprising:

determining a data-type of the respective amount of data currently written to the first block; and the determining whether to move the respective amount of data currently written to the first block to the second block is further based at least in part on the data-type of the respective amount of data currently written to the first block.

15. The method of claim 9, further comprising:

determining a file-type of the respective amount of data currently written to the first block; and the determining whether to move the respective amount of data currently written to the first block to the second block is further based at least in part on the file-type of the respective amount of data currently written to the first block.

16. The method of claim 9, wherein determining whether to move the respective amount of data currently written to the first block to the second block based at least in part on the total memory utilization value for the NVRAM being below the utilization limit and the data generation value for the respective amount of data currently written to the first block comprises:

determining whether the data generation value for the respective amount of data currently written to the first block is above a generation limit, wherein the respective amount of data written to the first block is not moved if the data generation value is below the generation limit.

17. A system comprising:

non-volatile solid-state memory having locations in which data is written;

a memory controller to write data to the locations of the non-volatile solid-state memory; and control logic configured to maintain, for the locations of the memory, a generation value of data written to a location of the non-volatile solid-state memory, and maintain wear values for the locations of the memory, configured to determine whether to move data written to a first location in the memory to a second location in the memory based at least in part on the data attribute information for the data written to the first location in the memory and the wear value for the second location in the memory, wherein the generation value for data written to a respective location of the memory is indicative of a number of write cycles that the data currently written to the respective location of the memory has persisted in the memory, and further configured to determine to not move data written to the first location in the memory to the second location in the memory responsive to the generation value for the data written to the first location in the memory being less than a generation limit.

18. The system of claim 17, the control logic configured to determine whether to move data written to the first location in the memory to the second location in the memory further being based at least in part on a memory utilization value for the memory, the memory utilization value being indicative of a ratio of a current amount of space in the memory in which data is currently stored to a total amount of space in the memory, the control logic configured to decide to not move the data written to the one location to the other location when the memory utilization value for the memory exceeds a utilization limit.

19. The system of claim 17, the control logic configured to determine whether to move data written to the first location in the memory to the second location in the memory further being based at least in part on a memory utilization value for the memory, the memory utilization value being indicative of a ratio of a current amount of space in the memory in which data is currently stored to a total amount of space in the memory, the control logic configured to decide to not move the data written to the one location to the other location when the memory utilization value for the memory indicates that there is no available space in the memory.

* * * * *